(12) United States Patent
Chaudhari

(10) Patent No.: US 9,859,450 B2
(45) Date of Patent: Jan. 2, 2018

(54) CIGS/SILICON THIN-FILM TANDEM SOLAR CELL

(71) Applicant: Ashok Chaudhari, Briarcliff Manor, NY (US)

(72) Inventor: Ashok Chaudhari, Briarcliff Manor, NY (US)

(73) Assignee: SOLAR-TECTIC, LLC, Briarcliff Manor, NY (US)

( * ) Notice: Subject to any disclaimer, the term of this patent is extended or adjusted under 35 U.S.C. 154(b) by 0 days.

(21) Appl. No.: 15/238,050

(22) Filed: Aug. 16, 2016

(65) Prior Publication Data
US 2016/0359061 A1    Dec. 8, 2016

Related U.S. Application Data

(60) Provisional application No. 62/369,238, filed on Aug. 1, 2016.

(51) Int. Cl.
| | | |
|---|---|---|
| *H01L 21/00* | (2006.01) | |
| *H01L 31/02* | (2006.01) | |
| *H01L 31/07* | (2012.01) | |
| *H01L 31/032* | (2006.01) | |
| *H01L 31/0236* | (2006.01) | |
| *H01L 31/0725* | (2012.01) | |
| *H01L 31/0392* | (2006.01) | |
| *H01L 31/0749* | (2012.01) | |

(52) U.S. Cl.
CPC .... *H01L 31/0322* (2013.01); *H01L 31/02363* (2013.01); *H01L 31/03923* (2013.01); *H01L 31/0725* (2013.01); *H01L 31/0749* (2013.01); *Y02E 10/541* (2013.01)

(58) Field of Classification Search
CPC ......... H01L 31/02; H01L 31/03; H01L 31/07; H01L 21/46; H01L 21/02
USPC .......... 438/71, 85, 97, 478, 482; 257/49–51, 257/E31.126, E31.017, E31.027, E21.461
See application file for complete search history.

(56) References Cited

U.S. PATENT DOCUMENTS

| | | | |
|---|---|---|---|
| 8,236,603 B1 * | 8/2012 | Fritzemeier | ......... H01L 31/0368 257/49 |
| 9,054,249 B2 | 6/2015 | Chaudhari | |
| 2002/0106873 A1 * | 8/2002 | Beck | ................... H01L 31/0322 438/482 |
| 2007/0122331 A1 * | 5/2007 | Amirzadeh-Asl | ........ C09C 3/08 423/274 |

(Continued)

OTHER PUBLICATIONS

Paire, M. et al. "Chalcogenide Thin-Film Solar Cells", (Conibeer, et ano. Ed.) Solar Cell Materials, 2014, p. 159, Wiley, UK.

(Continued)

*Primary Examiner* — Sheikh Maruf
(74) *Attorney, Agent, or Firm* — Carter, Ledyard and Milburn LLP

(57) ABSTRACT

A method of making a CIGS/inorganic thin film tandem semiconductor device including the steps of depositing a textured buffer layer on an inexpensive substrate, depositing a metal-inorganic film from a eutectic alloy on the buffer layer, the metal being selected from a group of CIGS elements, and adding the remaining CIGS elements to the metal, thereby growing a CIGS film on the inorganic film for the tandem semiconductor device.

30 Claims, 2 Drawing Sheets

(56) References Cited

U.S. PATENT DOCUMENTS

| | | | |
|---|---|---|---|
| 2009/0020157 A1* | 1/2009 | Krasnov | H01L 31/022425 136/256 |
| 2010/0203263 A1* | 8/2010 | Czubatyj | C23C 14/0623 427/596 |
| 2010/0218820 A1* | 9/2010 | Kim | H01L 31/022425 136/256 |
| 2010/0236629 A1* | 9/2010 | Chuang | H01L 31/022425 136/262 |
| 2010/0297835 A1* | 11/2010 | Chuang | H01L 21/02422 438/488 |
| 2013/0037093 A1* | 2/2013 | Lee | H01L 31/022425 136/256 |
| 2013/0037111 A1 | 2/2013 | Mitzi et al. | |
| 2013/0164885 A1 | 6/2013 | Liang et al. | |
| 2013/0244370 A1* | 9/2013 | Tadakuma | H01L 31/18 438/95 |
| 2013/0247969 A1* | 9/2013 | Kim | H01L 31/0468 136/256 |
| 2013/0284252 A1* | 10/2013 | Krasnov | H01L 31/022425 136/256 |
| 2013/0316519 A1* | 11/2013 | Mitzi | H01L 21/02422 438/478 |
| 2014/0113403 A1* | 4/2014 | Van Duren | H01L 21/02557 438/95 |
| 2014/0193943 A1* | 7/2014 | Lin | C23C 14/34 438/95 |
| 2014/0249324 A1* | 9/2014 | Harris | H01L 31/0322 556/28 |
| 2014/0264708 A1 | 9/2014 | Van Duren et al. | |
| 2014/0283913 A1* | 9/2014 | Whitelegg | H01L 31/022425 136/260 |
| 2014/0290739 A1* | 10/2014 | Deguchi | H01L 31/0322 136/258 |
| 2014/0352772 A1* | 12/2014 | Kim | H01L 31/02167 136/256 |
| 2015/0020864 A1 | 1/2015 | Dufourcq et al. | |
| 2015/0162480 A1* | 6/2015 | Cho | H01L 31/0322 136/262 |
| 2015/0280050 A1* | 10/2015 | Wang | H01L 31/1864 438/85 |
| 2016/0284901 A1* | 9/2016 | Cho | H01L 31/0256 |

OTHER PUBLICATIONS

Vasekar, P. et al. "Photovoltaic Characterization of Copper-Indium-Gallium Sulfide (CIGS2) Solar Cells for Lower Absorber Thicknesses", Thin Solid Films, 2010, pp. 1788-1790, vol. 518, Elsevier, USA.

* cited by examiner

CIGS/SILICON THIN-FILM TANDEM SOLAR CELL

This application claims priority to U.S. Provisional Patent Application No. 62/369,238 filed Aug. 1, 2016, entitled "CIGS/Silicon Thin-Film Tandem Solar Cell" and is hereby incorporated by reference in its entirety.

The present invention relates to I-III-VI group materials for thin-film solar cells, transistors, light emitting diodes, and other devices. Particularly, the invention relates to CIGS (copper indium gallium selenide/sulfur) and its variations, i.e. CGS, CIS, and $CIGS_2$.

BACKGROUND

CIGS, or Copper Indium Gallium Selenide (or Sulfur "S"), is a I-III-VI group compound semiconductor. Elements from these groups are especially attractive for solar applications because of their high optical absorption coefficients and versatile optical and electrical characteristics, which can in principle be manipulated and tuned for a specific need in a given device. CIGS is one of three mainstream thin-film PV technologies, the other two being cadmium telluride and amorphous silicon. A direct bandgap material, CIGS has very strong light absorption and a layer of only 1-2 micrometers ($\mu m$) is enough to absorb most of the sunlight. By comparison, a much greater thickness of about 160-190 $\mu m$ is required for crystalline silicon wafers (not crystalline silicon thin-film which only requires up to 30 $\mu m$). Recently, many in the solar cell R&D community have concluded that a multi-junction or tandem solar cell is the best solution to solving the problem of solar cell efficiency and bringing costs down. Combining a thin-film of CIGS with a thin inorganic film, such as silicon or germanium, which has a lower bandgap than CIGS (or CGS), would make an ideal tandem device. Yet this has not been achieved. The present invention offers a way to achieve this that is simple, cost-effective, and non-toxic.

SUMMARY OF THE INVENTION

It is well known that the main challenge to maximizing efficiency in CIGS thin-film solar cells has to do with fabrication methods. It is also known that tandem solar cells are an excellent solution to the problem of efficiency (>25% is needed to surpass silicon wafers) in solar cells, as well as being cost effective—assuming fabrication methods can achieve this. Here we disclose a completely novel method of fabricating CIGS thin-film solar cells with high efficiency that is cost effective and simple, and that can easily be combined with an inorganic film such as silicon or germanium. The method takes advantage of the fact that 3 out of the 4 elements of the CIGS compound form eutectic alloys with inorganic elements such as Si and Ge. Following the patented technology for crystalline inorganic thin-film growth invented by P. Chaudhari (U.S. Pat. No. 9,054,249 B2 (incorporated by reference in its entirety)), a crystalline silicon (or germanium or other inorganic material) is deposited on a buffered glass (or metal tape) substrate. The buffer consists of a textured oxide or nitride and can be an insulator or conductor such a TiN. A metal selected from any of the three metals in CIGS—copper, indium, gallium—is used as the metal in the eutectic alloy melt required for the crystalline inorganic thin-film growth process in U.S. Pat. No. 9,054,249 B2. For example, if gallium is used, then the eutectic alloy would be Ga—Si. After deposition, the Ga segregates to the surface of the Si film and forms a thin-layer (a known phenomenon observed in metal-induced crystallization, MIC, AIC, ALILE, etc). Other elements of the CIGS material can now be added, followed by sulfurization of the metal film. These steps form a CIGS material on the Si film for a heterojunction planar tandem solar cell (or other electronic device). No toxic CdS heterojunction partner window layer is necessary as is common practice, since the silicon (or other inorganic material) can take its place and can provide the n-type layer required for the p-n junction. If a recombination layer or intermediate layer or ESL layer is desirable, the metal on the Si surface can be oxidized. For example, indium can be used in which case $InO_2$ (or $In_2O_3$) would be formed. Or Cu can be used (from solid phase) in which case $CuO_2$ would be used. A CIGS film can then be deposited on that layer using known CIGS industry deposition methods. Other, various depositions processes known in the art can be used for film growth of CIGS, including co-evaporation, in accomplishing one of the steps of the invention.

The present invention provides a method of making a CIGS/inorganic thin film tandem semiconductor device including the steps of depositing a textured buffer layer on an inexpensive substrate, depositing a metal-inorganic film from a eutectic alloy on the buffer layer, the metal being selected from a group of CIGS elements, and adding the remaining CIGS elements to the metal, thereby growing a CIGS film on the inorganic film for the tandem semiconductor device.

The present invention also provides a method of making a CIGS/inorganic multi-junction thin-film tandem solar cell including the steps of depositing a textured buffer layer on an inexpensive substrate, depositing a first metal-inorganic film from a eutectic alloy on the buffer layer, the first metal being selected from at least one of copper, indium or gallium, segregating the first metal to the surface of the inorganic film, adding a second metal-inorganic film from a eutectic alloy on the first film, the second metal being selected from a remaining element of the at least one of copper, indium or gallium, segregating the second metal to the surface of the second inorganic film, adding a third metal-inorganic film from a eutectic alloy on the second film, the third metal being selected from a final remaining element of the at least one of copper, indium or gallium, segregating the third metal to the surface of the third inorganic film, the first, second and third metal inorganic films each forming a layer of a stack, and depositing or sulfurization of the stack, wherein each layer of the stack together form a multi-junction solar cell.

BRIEF DESCRIPTION OF THE DRAWINGS

A more detailed understanding of the invention may be had from the following description of a preferred embodiment, given by way of example and to be understood in conjunction with the accompanying drawing.

DETAILS OF THE INVENTION

Figure 1:
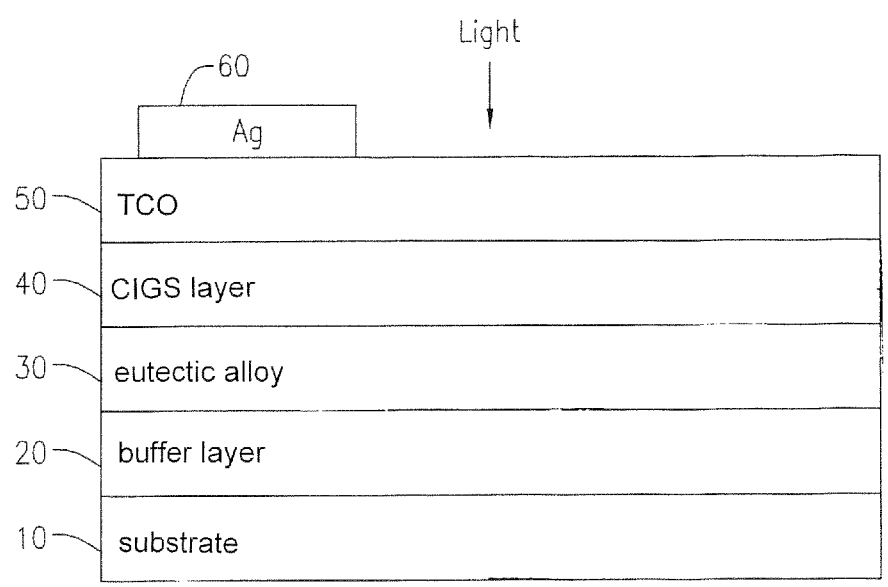
FIG. 1 shows an exemplary device architecture of the present invention.

As used herein, the term 'textured' generally refers to the crystals in the film have preferential orientation either out-of-plane or in-plane or both. For example, in the present invention the films could be highly oriented out-of-plane, along the c-axis.

As used herein, the term 'large grain' is generally understood to mean a grain size larger than would have been achieved if a silicon (or other inorganic material) had been deposited under the same conditions but without metals, i.e. Cu, In, and Ga. Moreover, 'large grain' means the grain size is comparable to or larger than the carrier diffusion length such that electron-hole recombination at grain boundaries is negligible. In semiconductor films this means that the grain size is greater than or equal to the film thickness.

The thin-film tandem semiconductor growth process summarized above, is now provided in further detail regarding specific aspects of the invention. When CIGS films are "In rich" (Cu deficient) the film's surface layer forms an ordered defect compound (ODC) with a stoichiometry of $Cu(In,Ga)_3Se_5$. This is necessary for a good interface with CdS, the necessary n-type window layer in CIGS devices. In order to increase the bandgap, however, CGS would be preferable to CIGS. One problem encountered in the industry is that CGS (unlike CIGS) does not form the ODC. If it did, a much higher bandgap of 1.5 eV could be achieved and therefore a more efficient solar cell device. The present invention solves this problem by replacing the CdS layer with an inorganic layer such as silicon, and then using CGS. Thus a higher bandgap (of 1.5 eV) is achievable. This higher bandgap potential is what makes CIGS a good tandem material with silicon or germanium as the underlying material with the lower bandgap of 1.12 eV or 0.6 eV respectively. It should be noted that in Cu rich films there is a recombination loss at the CIGS/CdS interface, therefore Cu deficiency has been viewed favorably. In the present invention, this Cu deficiency is no longer necessary since the CdS layer is replaced.

In current CIGS manufacturing practice, to reach the ideal bandgap for a single junction (non-tandem) solar cell, 1.5 eV, it is known that a Ga/(In+Ga) ratio of roughly 0.7 is optimal. However, at ratios above ~0.3, device performance drops off. Industry currently targets the 0.3 Ga/(In+Ga) ratio, resulting in bandgaps between 1.1 and 1.2 eV. The decreasing performance has been postulated to be a result of CGS, unlike CIGS, not forming the ODC, which is necessary for a good interface with CdS. Again, the present invention avoids this issue by replacing CdS with another material. For the purposes of the present invention, a bandgap higher than 1.5 eV is desirable. In fact, the ideal bandgap in tandem with Si is 1.8 eV.

In current CIGS manufacturing processes, highest efficiency devices show substantial texturing, or preferred crystallographic orientation. Texture or preferred orientation improves the electrical properties of semiconductor films of many types but achieving this texture is not easy. For CIGS a (204) surface orientation is observed in the best quality devices. In the present invention, texture is also achieved in the CIGS films. Here, the texture is achieved by the influence of the underlying inorganic film in the tandem cell which induces texture in the CIGS (CGS) film formed on top of it. Or, alternatively, the ESL layer (previously mentioned), which also forms texture from the underlying inorganic film can induce preferential orientation in the CIGS film grown on top if this is desirable. If the underlying film texture is [111], then the CIGS films will also be inclined to form this texture.

The Se supply and selenization environment is important in determining the properties and quality of the CIGS film. When Se is supplied in the gas phase (for example as $H_2Se$ or elemental Se) at high temperatures, the Se becomes incorporated into the film by absorption and subsequent diffusion. During this step, called chalcogenization, complex interactions occur to form a chalcogenide. These interactions include formation of Cu—In—Ga intermetallic alloys, formation of intermediate metal-selenide binary compounds and phase separation of various stoichiometric CIGS compounds. Because of the variety and complexity of the reactions, the properties of the CIGS film are difficult to control. The present invention solves this control issue because of the way that the metal film is grown, i.e. the first metal film is formed with texture on the crystalline and textured inorganic film itself and thus can be carefully controlled, both with regard to its own crystallization and layer thickness.

In one CIGS manufacturing process currently used in the industry—called the "3 stage process"—the deposition of the CIGS film begins with the formation of $(In, Ga)_2Se_3$. Then, Cu is evaporated until a copper rich compound is reached. The temperature of the substrate has to be brought to 500° C.-600° C. during this phase to enable good crystallization with formation of large grains. In the third stage, In and Ga are evaporated in the presence of a Se overpressure. This three stage process is a stationary process that is difficult to control (see M. Paire et al "Chalcogenide thin-film solar cells", p. 159). Here, in the present invention, if copper is used as the metal in the metal-silicon eutectic alloy, which comes first in the process, the other elements are added afterwards. In this sense, the process in this invention is the reverse of the known "3 stage process". Also, as stated above, the present invention allows for careful control of the metal crystallization process.

The Se source affects the resulting film properties. $H_2Se$ offers the fastest Se incorporation into the absorber; 50 at % Se can be achieved in CIGS films at temperatures as low as 400° C. By comparison, elemental Se only achieves full incorporation with reaction temperatures above 500° C. Films formed at lower temperatures from elemental Se were Se deficient, but had multiple phases including metal selenides and various alloys. Use of $H_2Se$ provides the best compositional uniformity and the largest grain sizes. However, $H_2Se$ is highly toxic and is classified as an environmental hazard. Therefore, instead of Se, sulfur, also a group VI element, is preferable. In the present invention, the main material system is therefore $CGS_2$ (copper gallium sulfide) since it comprises sulfur and may have a higher bandgap. Additionally, as already stated, the present invention seeks to avoid the need for CdS in devices since cadmium is also known to be toxic. Thus, the present invention seeks to be entirely non-toxic, and in doing so may circumvent the technical issues covered above that need to be overcome regarding the effects of Se, CdS.

It should be emphasized that in the present invention the inorganic layer, silicon for example, takes the place of the Cds buffer layer, since it can be n-type and can therefore provide the n for the p-n junction. Therefore, the present invention solves a longstanding objective in the CIGS manufacturing community, namely, the development and implementation in the production lines of Cd-free alternative buffer layers. (see M. Paire et al "Chalcogenide thin-film solar cells", p. 159), while simultaneously also providing a tandem sub-cell material.

In CIGS module fabrication, MO is used as a back contact substrate onto which Cu is deposited. In the present invention, however, another material can—if desirable—replace MO because the metal from the eutectic can be oxidized to form a transparent conducting layer or contact for charge extraction. For example, In can be oxidized to form $In_2O_3$. Since this a transparent conducting oxide, other materials such as MgO or $Al_2O_3$ can be used as buffer layers, even though they are insulators. In other words, $In_2O_3$ can be grown on the inorganic film which in turn has been grown on the textured buffered insulator, say MgO, for example.

In current CIGS manufacturing practice, sodium incorporation is necessary for optimal performance. Ideal Na concentration is considered to be approximately 0.1%. Na is commonly supplied by the soda-lime glass substrate, but in processes that do not use this substrate the Na must be deliberately added. Na's beneficial effects include increases in p-type conductivity, texture, and average grain size. Furthermore, Na incorporation allows for performance to be maintained over larger stoichiometric deviations. However, in the present invention, the incorporation of sodium is not necessary since texture and grain size are enhanced by the underlying layer on which CIGS is deposited, p-type conductivity and performance maintenance over large stoichiometric deviations are also expected to be enhanced in the present invention due to increased control leading to improved crystallinity. For the underlying inorganic layer is not only textured but large grained. The large grains are formed from the metal-induced crystallization process using eutectic alloys, disclosed in the patent by P. Chaudhari referred to earlier (U.S. Pat. No. 9,054,249 B2.) As already stated, in the present invention, [111] surface normal orientation (c-axis aligned) is possible, for both CIGS and CGS, if for instance an MgO [111] highly textured buffer layer is used, and the Si is highly [111] oriented. The CIGS material deposited on this layer is expected to replicate the texture and grain size which, again, are made larger by the use of metal in the inorganic film (per U.S. Pat. No. 9,054,249 B2).

In one embodiment of the present invention, shown in FIG. 1, a multi-junction device is formed in the following way: a layer of silicon (or other inorganic film) is deposited on the textured buffer layer 20 on substrate 10 with one of each of the metals from CIGS—i.e. copper, indium, gallium—which forms a eutectic alloy 30 with silicon, and each remaining layer is deposited consecutively 40 such that there are 3-4 layers stacked monolithically on each other. Starting, for example, with copper (Cu—Si), then indium (In—Si), then gallium (Ga—Si), then finally selenium without Si or sulfur. The metal layer on each Si layer can be oxidized in which case $CuO_2$, $InO_2$, $GaO_2$, would be formed. Or, alternatively, they can be left as thin metal films. Whichever the case, both films serve as transparent conducting oxides 50 or electronic transport layers. In a final step, the stack of eutectic alloy layers is either sulfurized or a final layer of Se is added to the top of the stack, to form a composite material. Such a triple junction "composite" device can have very high efficiency—up to the theoretical 86%, especially if even more layers are added by replicating the process. The sequence of the metals can be varied if need be. For example, the first layer could be a Ga—Si eutectic, etc. Sulfurization of the material can take place at the end, or after each layer is formed. The final material is a composite of silicon and the various CIGS metals. It may be preferable in on one embodiment to use very thin layers of material under 50 nm, 30 nm, or even 10 nm in order to improve the device efficiency by allowing better light absorption as well as contact between the CIGS materials.

For contacts to the multi-junction cell, ZnO can be used as the top TCO 50 and MO can be used as the bottom contact/substrate 10. Alternatively, the oxidized metal films between the layers can serve as a contact. For example, $Cu_2O$ or $InO_2$ are known to be good conducting oxides. A top contact electrode 60 made of Ag, for example, can be formed to complete the device.

It is known that in tandem solar cells, the more difficult architecture is the monolithically integrated cell, where the cell consists of a number of layers that are mechanically and electrically connected. These cells are difficult to produce because the electrical characteristics of each layer has to be carefully matched. In particular, the photocurrent generated in each layer needs to be matched, otherwise electrons will be absorbed between the layers. This limits their construction to certain materials (best met by III-V semiconductors). The present invention enables the use of this architecture in a simple and cost effective manner. Current can be carefully controlled by the absorber thicknesses of the tandem layers. The present invention facilitates this control greatly because the layers are deposited with precision using for example e-beam evaporation or sputtering, and the layers are thin-films, not wafers cut from a boule. Thus very thin films can be deposited, and fine-tuned to reach the exact thickness. It is also known that bandgap tuning can control the current. In the present invention, various CIGS bandgaps are tunable as a function of the particular eutectic metals, and the stoichiometry that is chosen, i.e. the ratio of metal/semiconductor compositions, and atomic % of the CIGS elements.

In one embodiment of the present invention, no charge carrying layer (electron selecting layer or hole transport layer or recombination layer) is necessary between the inorganic film and the top CIGS layer because of the texture or orientation of the materials. Such texture or alignment allows for improved, good contact between the materials.

In one embodiment of the present invention, a triple junction device is formed by using thin-film silicon (or another inorganic material) followed by CIGS followed by an even wider bandgap material such as perovskite. A triple junction solar cell can have even higher cell efficiency than a dual junction cell. This embodiment of the invention builds on work by others who have successfully grown perovskites on CIGS thin film layers.

In yet another embodiment of the present invention, the morphology of the CIGS layer has a morphology substantially matching the morphology of the inorganic film or other substrate to which the layer is applied. For example, the RMS (root mean squared) roughness of the CIGS layer of the present invention is less than 10 nm, and preferably less than 5 nm and even preferably less than 3 nm.

Regarding CIGS growth processes, the most common vacuum-based process is to co-evaporate or co-sputter copper, gallium, and indium onto a substrate at room temperature, then anneal the resulting film with a selenide vapor. An alternative process is to co-evaporate copper, gallium, indium and selenium onto a heated substrate. These same processes known in the art can be used in the present invention for the deposition of the copper, indium and gallium elements in the CIGS material, for example.

It should be noted that if an n-type layer besides the inorganic film is desirable in the device structure, ZnS is an alternative that is non-toxic. For the top TCO layer ZnO can be used, followed by Ag contacts.

EXAMPLE OF THE INVENTION

Figure 2:
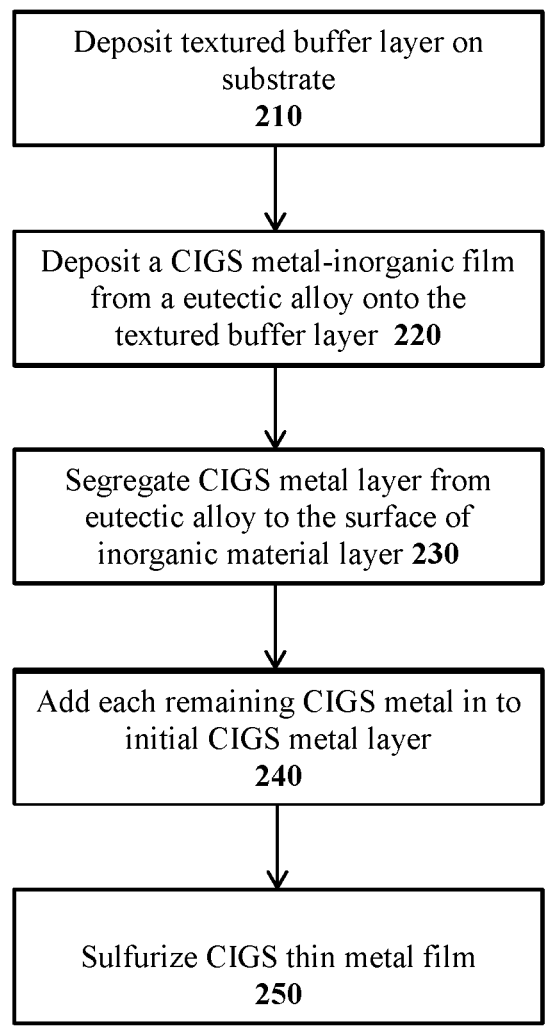
FIG. 2 shows a process flow chart for an example of the present invention.

FIG. 2 shows the process flow of the following example. A good high vacuum system with two electron beam guns is used to deposit copper and silicon independently. A soda-lime glass substrate coated with textured MgO [111], 210, is held at temperatures between 575 and 600° C. These are nominal temperatures. It is understood to one skilled in the art that lower or higher temperatures can also be used depending upon the softening temperature of the glass substrate or the reaction kinetics of either copper or silicon with the MgO layers when used a substrates. A thin copper film of approximately 10 nm thickness is deposited first 220. This is followed by a silicon film deposited, 220, at a rate of 2 nm per minute on top of the copper film at a temperature that is below the liquid eutectic phase temperature, namely, 550° C.-600° C. (If a greater $Cu_2O$ film thickness as the top layer is desirable, a greater ratio of copper to Si can be used. Film thicknesses can be controlled for current matching.) The silicon atoms diffuse through the copper to heterogeneously nucleate on the MgO surface and propagate this crystallinity to the silicon film remaining on the copper. The film can now be cooled to room temperature, where the film now comprises of two phases: copper and a relatively large grained and highly textured film of silicon on MgO. The copper diffuses to the surface of the silicon film. 230, driven by its lower surface energy relative to the silicon surface. Rather than etching the film in a solution, which removes the Cu from the two phases, Cu and silicon, leaving behind a silicon film (practiced in U.S. Pat. No. 9,054,249), the Cu in the Cu—Si film can now be used as a component in CIGS and the other elements can be deposited on the Cu layer 240 (with stoichiometric composition chosen based on experimentation and optimization) at the same temperature (575° C.-600° C.) using co-evaporation or other appropriate deposition techniques well known in the CIGS industry, followed by sulfurization ("S") of the metal film 250 in dilute $H_2 S$ (4-8% $H_2S$) ambient at 475° C. for 30-60 min (using a sulfurization procedure previously described by P. S. Vasekar et al). In this way, a non-toxic alternative to Se is accomplished and the CIGS layer is formed directly on the silicon layer with texture (preferential crystal orientation) and uniformity. This is now a planar heterojunction monolithic architecture for solar and other devices. Or alternatively, the Cu layer on Si is oxidized by introducing $O_2$ to the copper to form a $Cu_2O$ film on the silicon.

For the Cu—Si deposition we have used two electron beam guns as an illustrative example. It is understood to one skilled in the art that other methods such as a single gun with multiple hearths, chemical vapor deposition, thermal heating, or sputtering, for example, can also be used.

Substrates besides glass, such as polyimides or metal tapes, can be used in the invention, which can be applied to numerous electronic devices, ranging from solar cells to LEDs to TFTs.

While the principles of the invention have been described in connection with specific embodiments, it should be understood clearly that the descriptions, along with the examples, are made by way of example and are not intended to limit the scope of this invention in any manner. For example, a variety of suitable substrates different from the examples given above can be utilized or a different variety of deposition methods and conditions can be employed as would be understood from this invention by one skilled in the art upon reading this document.

What is claimed is:

1. A method of making a CIGS/inorganic thin film tandem semiconductor device comprising the steps of:
    depositing a textured buffer layer on an inexpensive substrate;
    depositing a CIGS metal-inorganic film from a eutectic alloy on said buffer layer, said CIGS metal-inorganic film comprising a CIGS metal layer and an inorganic film layer, wherein said CIGS metal layer being one selected from a group of copper, indium or gallium;
    segregating said CIGS metal layer from said inorganic film layer and diffusing to a surface of said inorganic film layer; and
    adding each of said remaining CIGS elements from the group to said CIGS metal layer, thereby growing a CIGS film on the inorganic film layer for said tandem semiconductor device.

2. The method of claim 1, further comprising adding $O_2$ to said CIGS metal film on the surface of said inorganic film, forming an oxide thin film on said inorganic film.

3. The method of claim 1, wherein said inorganic film is silicon.

4. The method of claim 1, wherein said inorganic film is germanium.

5. The method of claim 1, wherein said tandem semiconductor device is a solar cell.

6. The method of claim 1, wherein said inorganic film is textured.

7. The method of claim 2, wherein said oxide film is textured.

8. The method of claim 1, wherein said inexpensive substrate is soda-lime glass.

9. The method of claim 1, wherein said inexpensive substrate is metal tapes.

10. The method of claim 1, wherein said CIGS film is textured.

11. The method of claim 1, further comprising depositing Se on said CIGS metal film along with said remaining CIGS elements of the group.

12. The method of claim 1, wherein sulfur is added with said remaining CIGS elements.

13. The method of claim 1, wherein said CIGS film is post annealed.

14. The method of claim 1, wherein indium is not used.

15. The method of claim 1, wherein a bandgap of said CIGS film is 1.5 eV.

16. The method of claim 1, wherein all depositions occur between 575° C. and 600° C.

17. The method of claim 1, wherein said CIGS film grain size is greater than 1 μm.

18. The method of claim 1, wherein said CIGS film thickness is 2 μm.

19. A method of making a CIGS/inorganic multi-junction thin-film tandem solar cell comprising the steps of:
    depositing a textured buffer layer on an inexpensive substrate;
    depositing a first metal-inorganic film from a eutectic alloy on said buffer layer, said first metal being selected from at least one of copper, indium or gallium;
    segregating said first metal to the surface of the inorganic film;
    adding a second metal-inorganic film from a eutectic alloy on said first film, said second metal being selected from a remaining element of the at least one of copper, indium or gallium;
    segregating the second metal to the surface of the second inorganic film;
    adding a third metal-inorganic film from a eutectic alloy on said second film, said third metal being selected from a final remaining element of the at least one of copper, indium or gallium;
    segregating the third metal to the surface of the third inorganic film, the first, second and third metal inorganic films each forming a layer of a stack; and
    depositing or sulfurization of the stack, wherein each layer of the stack together form a multi-junction solar cell.

20. The method of claim 19, further comprising oxidizing the first, second and third metal that segregates to the surface of each film by introducing $O_2$.

21. The method of claim 19, further comprising matching the current of each layer of the stack.

22. The method of claim 19, wherein the thickness of each layer is the same.

23. The method of claim 19, wherein the first, second and third inorganic film are textured.

24. The method of claim 19, wherein the CIGS film has a bandgap between 1.5 eV and 1.7 eV.

25. The method of claim 19, further comprising introducing sulfur to each layer of the stack prior to the addition of a next layer.

26. The method of claim 19, further comprising adding a perovskite layer to the CIGS stack forming a triple junction solar cell.

27. The method of claim 19, wherein the CIGS/inorganic multi-junction thin-film is a composite of silicon and the CIGS metals.

28. The method of claim 19 wherein the layers are less than 50 nm thick.

29. The method of claim 1, further comprising controlling a crystallization and a layer thickness of the CIGS film.

30. The method of claim 1, wherein the remaining CIGS elements are individually added to the inorganic film, each forming a layer of a stack.

* * * * *